(12) United States Patent
Hilliger et al.

(10) Patent No.: US 7,002,196 B2
(45) Date of Patent: Feb. 21, 2006

(54) FERROELECTRIC CAPACITOR DEVICES AND FERAM DEVICES

(75) Inventors: Andreas Hilliger, Kanagawa-ken (JP); Jenny Lian, Wallkill, NY (US)

(73) Assignee: Infineon Technologies AG, Munich ( * ) Notice: Subject to any disclaimer, the term of this patent is extended or adjusted under 35 U.S.C. 154(b) by 0 days.

(21) Appl. No.: 10/713,239

(22) Filed: Nov. 13, 2003

(65) Prior Publication Data

US 2005/0106759 A1 May 19, 2005

(51) Int. Cl.
*H01L 29/76* (2006.01)

(52) U.S. Cl. ............... 257/295; 257/296; 257/303; 257/305; 438/3; 438/253; 438/396

(58) Field of Classification Search ......... 257/295–296, 257/303–306, 532; 438/396, 253, 3
See application file for complete search history.

(56) References Cited

U.S. PATENT DOCUMENTS

| | | | |
|---|---|---|---|
| 6,346,741 B1 | 2/2002 | Van Buskirk et al. | |
| 6,534,809 B1 * | 3/2003 | Moise et al. ............. | 257/295 |
| 6,538,272 B1 * | 3/2003 | Yamazaki et al. ........ | 257/295 |
| 6,583,507 B1 | 6/2003 | Moon et al. | |
| 6,872,995 B1 * | 3/2005 | Hase ..................... | 257/295 |
| 2001/0019141 A | 9/2000 | Takahashi | |
| 2002/0142489 A1 | 10/2002 | Matsuura et al. | |
| 2002/0185671 A1 | 12/2002 | Kim | |
| 2002/0190299 A1 | 12/2002 | Hsue et al. | |
| 2003/0030093 A1 | 2/2003 | Agarwal et al. | |

FOREIGN PATENT DOCUMENTS

EP   0 969 506   1/2000

* cited by examiner

*Primary Examiner*—Dung A. Le
(74) *Attorney, Agent, or Firm*—Fish & Richardson P.C.

(57) ABSTRACT

A ferroelectric capacitor device, such as an FeRAM device is formed of a substrate having one or more contact plugs extending therethrough, and a first interlayer dielectric layer formed on the substrate. A spacer layer is formed on the first interlayer dielectric layer, a first oxygen barrier layer is formed on the spacer layer and a buffer layer is formed on the first oxygen barrier layer. A layer of liner material is formed on the buffer layer between the buffer layer and the contact plugs and a dielectric layer is sandwiched between a first electrode and a second electrode. A second oxygen barrier layer is applied to the device. The spacer layer should prevent any oxidation from reaching the interface between the liner material and the contact plugs as this interface is located beneath the first oxygen barrier layer. As a result, the electrical contact is not damaged.

18 Claims, 5 Drawing Sheets

US 7,002,196 B2

FERROELECTRIC CAPACITOR DEVICES AND FERAM DEVICES

FIELD OF THE INVENTION

The present invention relates to a device and method for forming ferroelectric capacitor devices and FeRAM devices. In particular, the present invention relates to a device and method for inhibiting oxidation of contact plugs in, for example, ferroelectric capacitor devices, such as FeRAM devices.

BACKGROUND OF THE INVENTION

In a conventional capacitor on plug (COP) device 1, such as the FeRAM shown in FIG. 1, contact plugs 2 are often used as vertical interconnects between metal lines in multilevel interconnect schemes. The contact plugs 2, which are typically formed of tungsten, pass through apertures in the substrate 4 of the device. The device 1 also includes a layer of ferroelectric material 6, such as PZT, with a top electrode 7 above the ferroelectric layer 6 and a bottom electrode 8 below the ferroelectric layer 6. A barrier layer 9, which is typically iridium (Ir) or titanium (Ti) based, is often positioned between the bottom electrode 8 (BE) and the substrate 4. The barrier layer 9 is deposited on top of the contact plugs 2 to block oxygen from causing damage when oxygen diffuses to the plugs 2. The barrier layer 9 improves contact resistance between the bottom electrode 8 and the contact plugs 2 and it also acts as a glue layer to improve adhesion of the bottom electrode 8 to the substrate 4. The apertures in the substrate 4 through which the contact plugs 2 extend are lined with the glue layer 9.

An oxygen barrier layer 10 of, for example, aluminium oxide, is typically deposited around the finished capacitor to reduce the amount of oxygen seeping into the capacitor along the glue layer 9 and oxidising the glue layer 9. This is most likely to occur during processing, particularly during the process of recovery annealing in an oxygen atmosphere, when oxygen may seep through faults in the oxygen barrier layer 10 which, if it reaches the plugs 2, may damage the contact between the bottom electrode 8 and the plugs 2 causing failure of the device.

In view of the foregoing problems with conventional processes and devices, a need exists for a method for inhibiting oxidation of the plug during the manufacture of a capacitor.

SUMMARY OF THE INVENTION

In general terms, the present invention proposes the inclusion of an additional insulating layer between a first interlayer dielectric layer and an oxygen barrier layer to move the oxygen barrier further away from the interface between the contact plug and the bottom electrode so that the interface is buried and not reached by oxygen during processing.

The present invention provides efficient protection of the interface between the contact plug and the bottom electrode against oxidation thereby improving device yield.

In a preferred embodiment, application of an additional oxygen barrier layer around the device serves to protect the device further from oxygen diffusion.

According to a first aspect of the present invention there is provided a device comprising:

a substrate having a contact plug extending therethrough;

a capacitor mountable on said substrate;

a first interlayer dielectric layer formed on said substrate;

a spacer layer formed on said first interlayer dielectric layer;

a first barrier layer formed on said spacer layer;

a buffer layer formed on said first barrier layer;

a layer of liner material formed on said buffer layer between said buffer layer and said contact plug;

a dielectric layer between a first electrode and a second electrode; and a second barrier layer extending over said device.

According to a second aspect of the present invention there is provided an FeRAM device comprising one or more of the above-defined devices.

According to a third aspect of the present invention there is provided a method for forming a ferroelectric capacitor device comprising the steps of:

forming a substrate;

forming a first interlayer dielectric layer on said substrate;

forming one or more contact plugs through said substrate;

forming a spacer layer on said first interlayer dielectric layer;

forming a first barrier layer on said spacer layer;

forming a buffer layer formed on said first barrier layer;

depositing a layer of liner material on said buffer layer between said buffer layer and said one or more contact plugs to form a first electrode;

forming a dielectric layer on said first electrode;

forming a second electrode on said dielectric layer; and forming a second barrier layer extending over said device.

According to a fourth aspect of the present invention there is provided a ferroelectric capacitor device formed according to the above-defined method.

According to a fifth aspect of the present invention there is provided an FeRAM device formed according to the above-defined method.

BRIEF DESCRIPTION OF THE DRAWINGS

Preferred features of the invention will now be described, for the sake of illustration only, with reference to the following Figures in which.

DETAILED DESCRIPTION OF PREFERRED EMBODIMENTS

FIGS. 2 to 5 show the various processing stages of: a device such as a ferroelectric capacitor, according to a preferred embodiment of the present invention.

Figure 1:
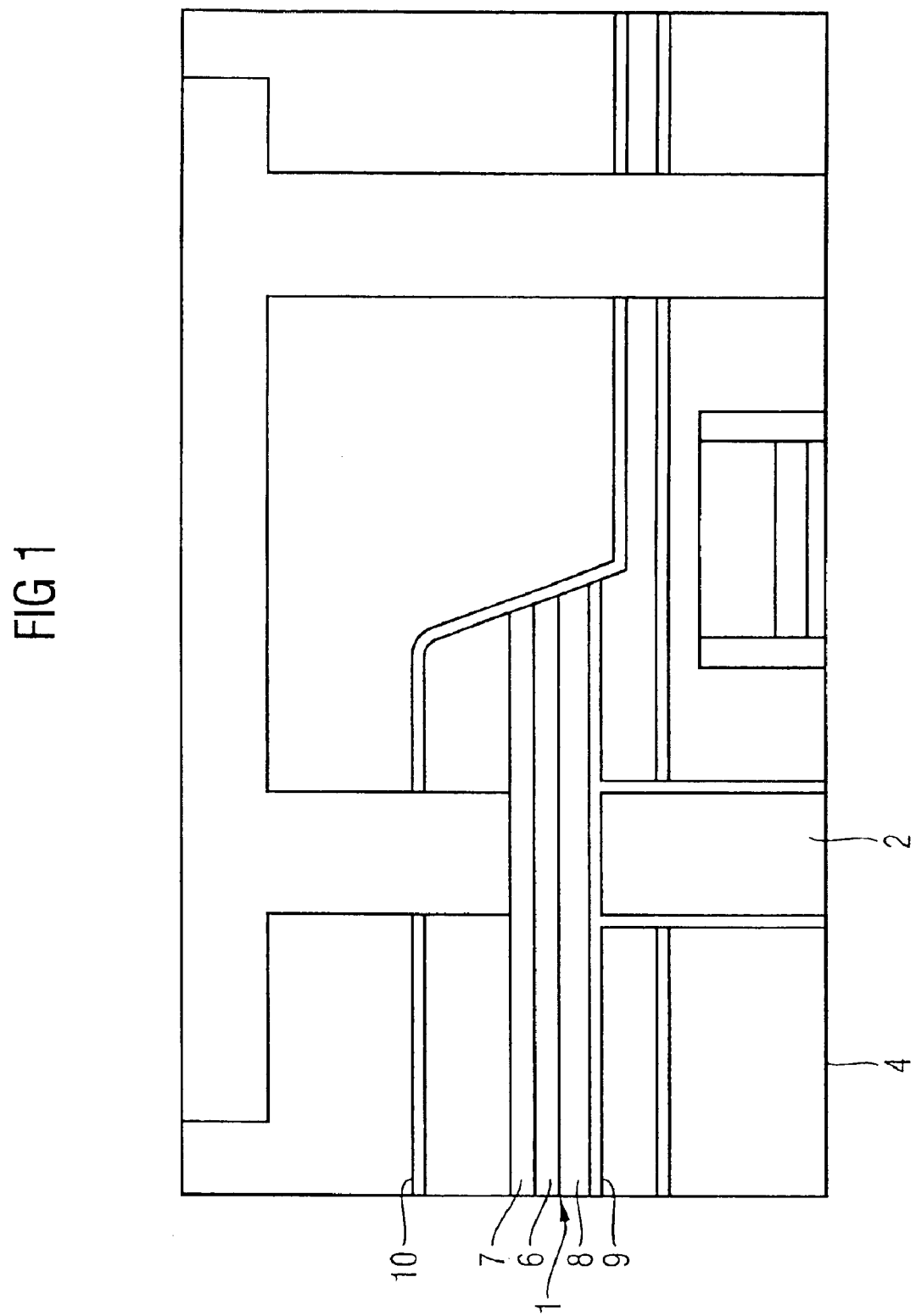
FIG. 1 is a schematic cross-section through a prior art ferroelectric capacitor.
Figure 2:
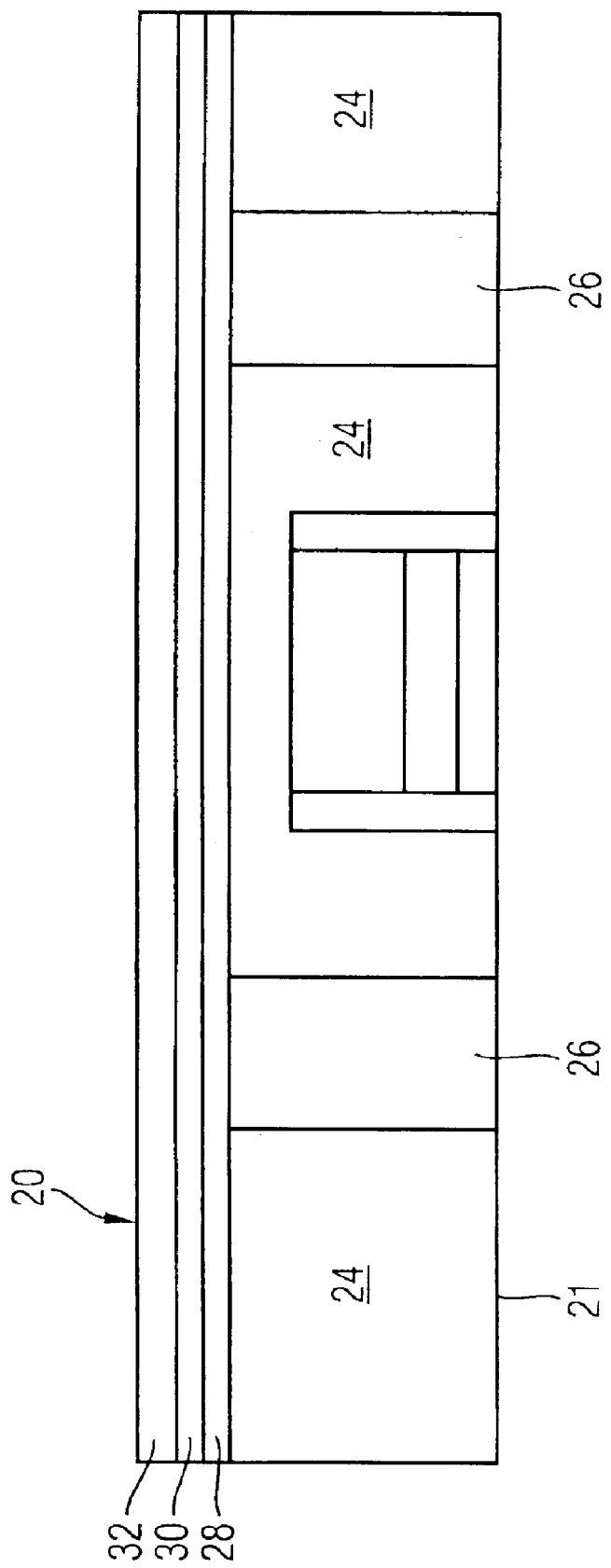
FIG. 2 is a schematic cross-section through a ferroelectric capacitor according to an embodiment in a first stage of production.

FIG. 2 shows the first stage in the production process of a device 20. The device 20 comprises a substrate 21 onto the underside of which are diffused the active control circuits (not shown) for the device 20, such as transistors. On the upper surface of the substrate 21, a first interlayer dielectric layer 24 is deposited and a chemical mechanical polishing process is applied to the interlayer dielectric layer 24. The interlayer dielectric layer 24 may be formed of, for example, boron-doped phosphosilicate glass (BPSG).

The contacts to the active control circuits are fabricated by etching apertures through the interlayer dielectric layer 24, as appropriate, and lining the apertures with a lining material such as iridium. The apertures are then filled with a metal, such as tungsten, to form contact plugs 26 connecting the active control circuits to the ferroelectric capacitor to be formed.

A vertical spacer layer 28 of electrically insulating material, such as silicon dioxide or TEOS, is deposited on the surface of the first interlayer dielectric layer 24. An oxygen barrier layer 30 of material resistant to oxygen diffusion, for example silicon nitride, is then deposited over the vertical spacer layer 28 to inhibit oxygen from penetrating into the substrate 21. A buffer layer 32 of, for example, silicon dioxide is applied over the oxygen barrier layer 30.

Figure 3:
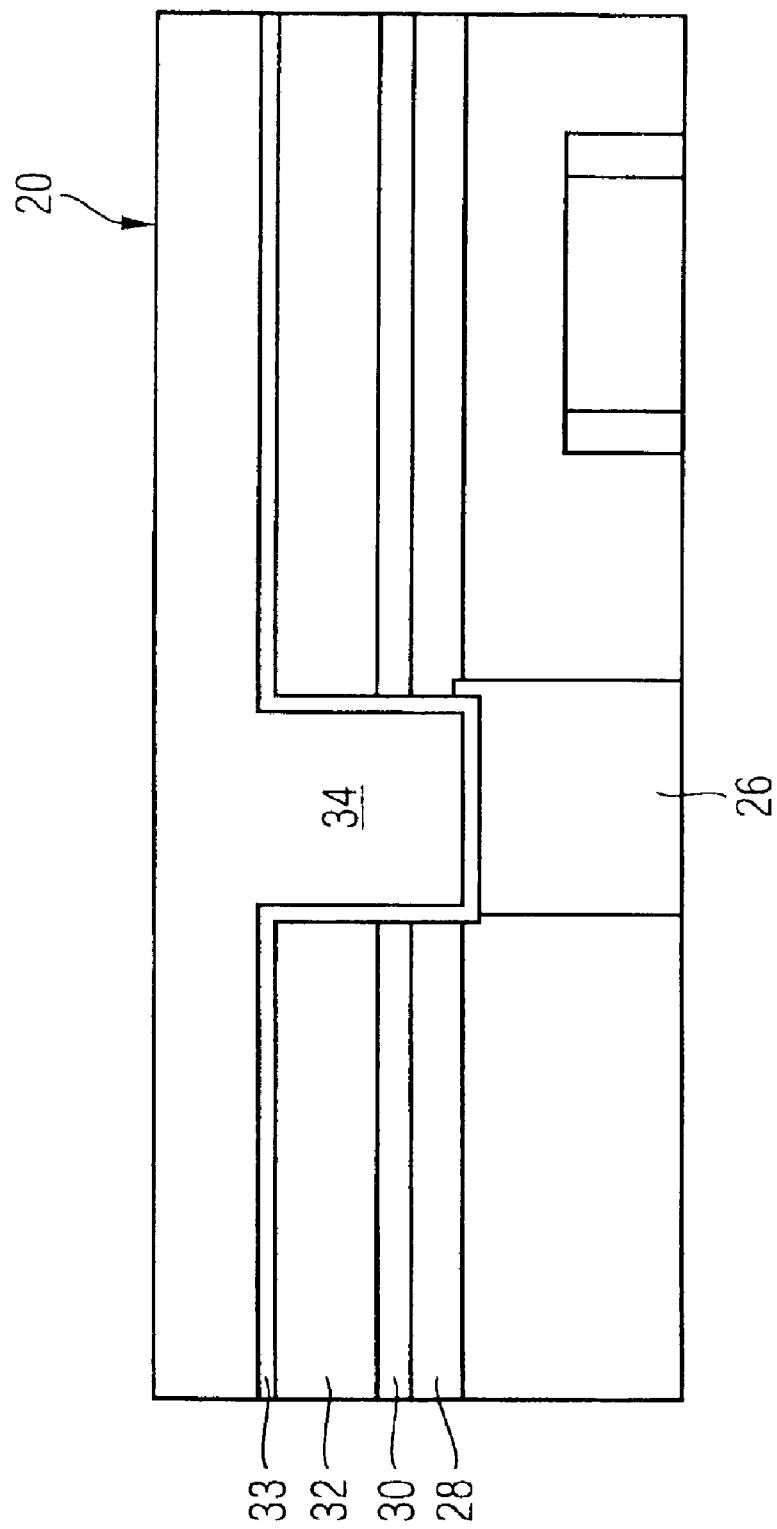
FIG. 3 is a schematic cross-section through a ferroelectric capacitor according to an embodiment in a second stage of production.
Figure 4:
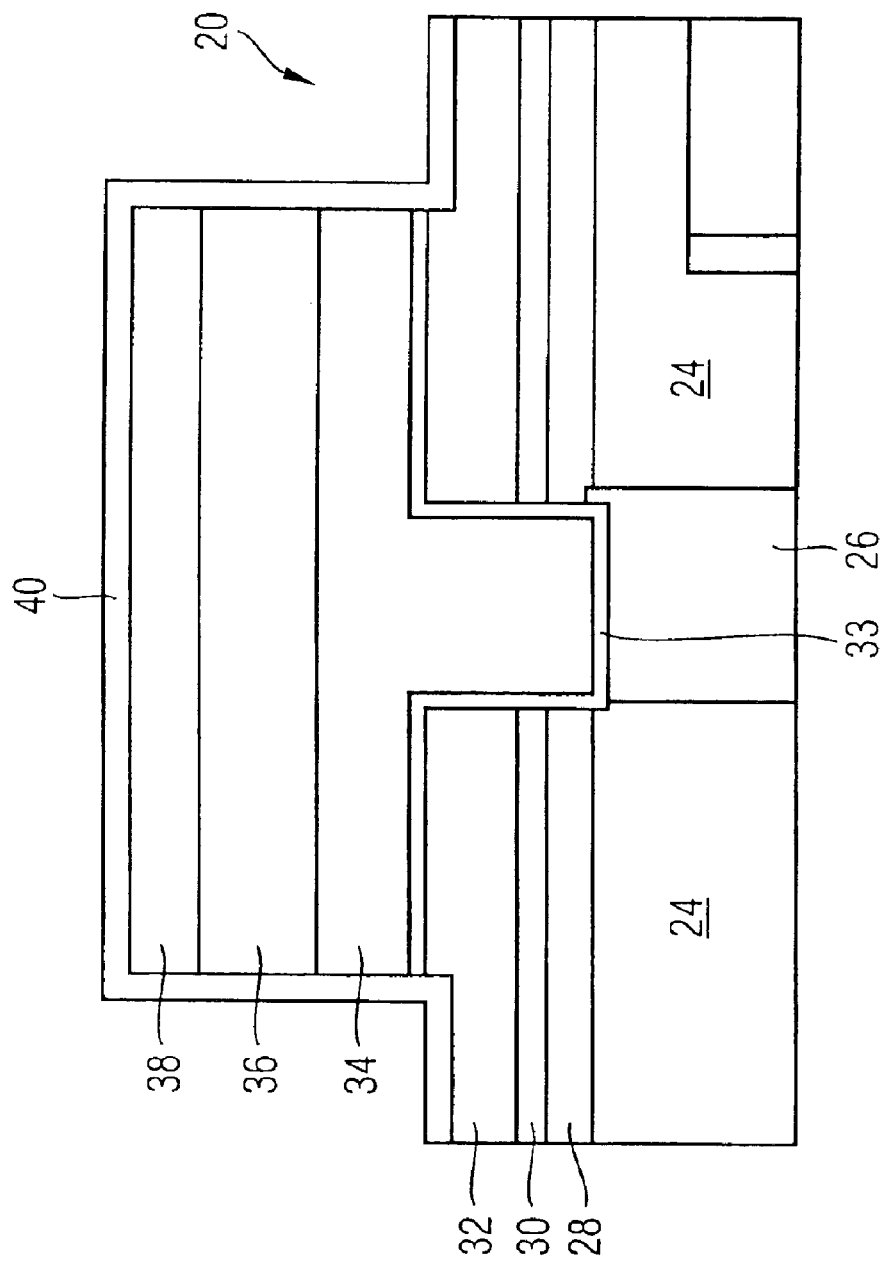
FIG. 4 is a schematic cross-section through a ferroelectric capacitor according to an embodiment in a third stage of production.
Figure 5:
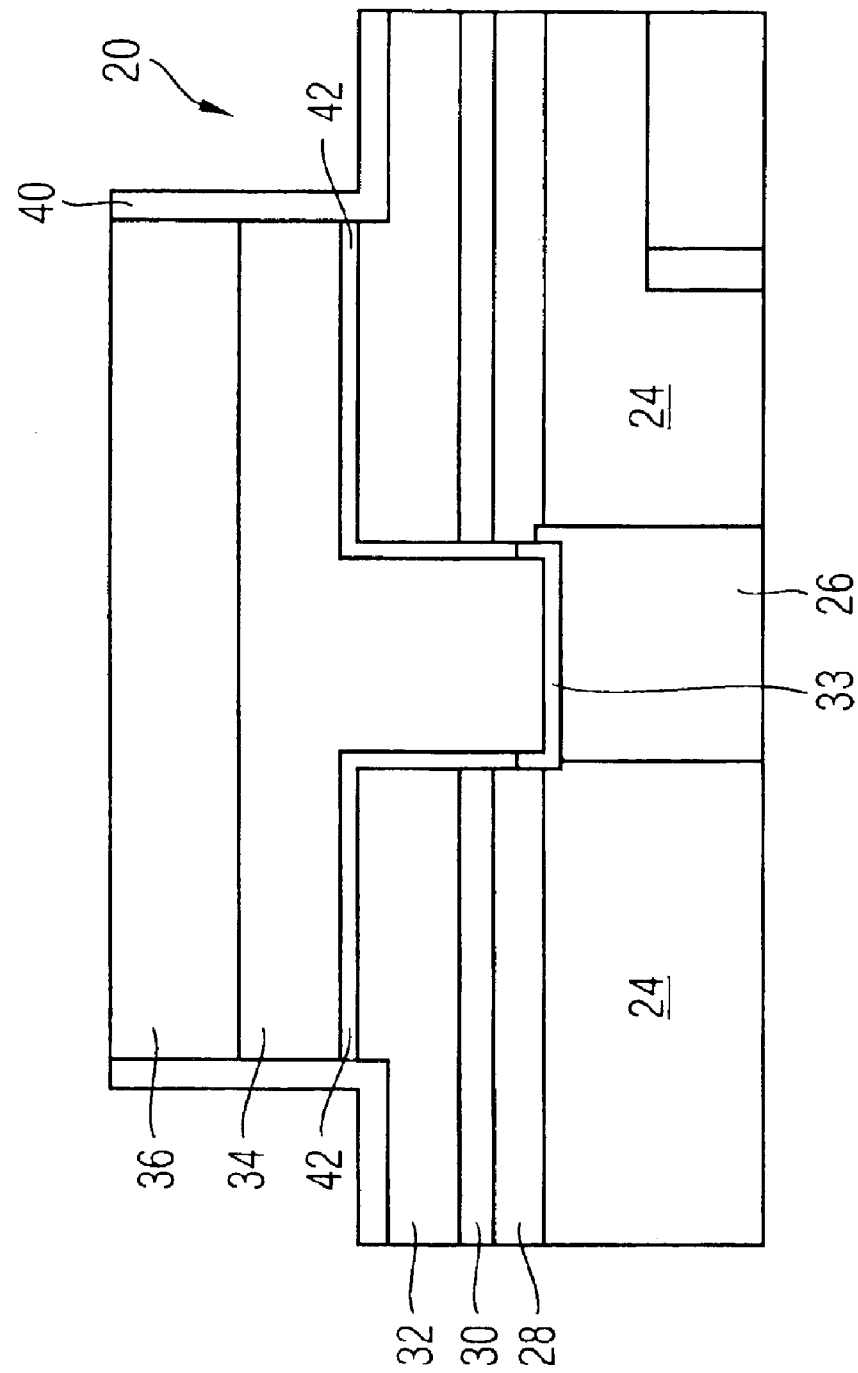
FIG. 5 is a schematic cross-section through a ferroelectric capacitor according to an embodiment in a fourth stage of production.

FIG. 3 shows the next stage in the production process which involves an RIE (reactive ion etch) to produce apertures extending through the vertical spacer layer 28, the oxygen barrier layer 30 and the buffer layer 32 into the top of the contact plugs 26 (only one of which is shown in FIGS. 3, 4 and 5). A liner 33 of, for example, iridium or iridium oxide is deposited over the etched surface and in the etched apertures down to the contact plugs 26. A layer of conducting material, for example tungsten, is deposited over the liner material 33 thereby filling the apertures to form the bottom electrode 34. The liner 33 acts as a glue layer to improve adhesion of the bottom electrode 34 to the buffer layer 32. If necessary, chemical mechanical polishing (CMP) may be performed and the layer of conducting material may be redeposited. However, the liner layer 33 should be kept on the surface of the buffer layer 32 as a glue layer to maintain adhesion.

FIG. 4 shows the next stage in the production process. A ferroelectric layer 36 of, for example, PZT is deposited on the surface of the bottom electrode 34 then a top electrode 38 is deposited over the ferroelectric layer 36. A hard mask material (not shown) is deposited over the top electrode 38 and a lithographic process is performed on the hard mask to shape the hard mask material. The hard mask is then etched through to the buffer layer 32 to define the capacitor. A further oxygen barrier layer 40 is deposited over the entire structure.

FIG. 5 shows the next stage in the production process. The device is subjected to an oxygen annealing process for capacitor recovery. Some oxygen may penetrate the further oxygen barrier 40 through faults therein and some of the liner material 33 could be partially oxidised as denoted by reference numeral 42 in FIG. 5. However, the vertical spacer layer 28 should prevent the oxidation from reaching the interface between the liner 33 and the contact plugs 26 as this interface is located beneath the oxygen barrier layer 30. Thus, this interface will not be reached by the small amounts of oxygen diffusing through weak spots in the further oxygen barrier layer 40 around the capacitor. As a result, the electrical contact is not damaged.

The systems and methods according to the present invention, may be particularly useful in the production of devices for use, for example, as ferroelectric random access memories.

Various modifications to the embodiments of the present invention described above may be made. For example, other materials and method steps can be added or substituted for those above. Thus, although the invention has been described above using particular embodiments, many variations are possible within the scope of the claims, as will be clear to the skilled reader, without departing from the spirit and scope of the invention.

What is claimed is:

1. A device comprising:

a substrate having a contact plug extending therethrough;

a capacitor mountable on said substrate;

a first interlayer dielectric layer formed on said substrate;

a spacer layer formed on said first interlayer dielectric layer;

a first barrier layer formed on said spacer layer;

a buffer layer formed on said first barrier layer;

a layer of liner material formed on said buffer layer between said buffer layer and said contact plug;

a dielectric layer between a first electrode and a second electrode;

a second barrier layer extending over said device.

2. A device according to claim 1, wherein said dielectric layer is formed of ferroelectric material.

3. A device according to claim 1, wherein said first interlayer dielectric layer is formed of boron-doped phosphosilicate glass (BPSG).

4. A device according to claim 1, wherein said layer of liner material is formed of iridium.

5. A device according to claim 1, wherein said layer of liner material is formed of iridium oxide.

6. A device according to claim 1, wherein said first electrode is formed of tungsten.

7. A device according to claim 1, wherein said spacer layer is formed of electrically insulating material.

8. A device according to claim 7, wherein said spacer layer is formed of silicon dioxide.

9. A device according to claim 7, wherein said spacer layer is formed of tetraethyl orthosilicate (TEOS).

10. A device according to claim 1, wherein said first barrier layer is formed of a material substantially resistant to oxygen diffusion.

11. A device according to claim 1, wherein said first barrier layer is formed of silicon nitride.

12. A device according to claim 1, wherein said second barrier layer is formed of a material substantially resistant to oxygen diffusion.

13. A device according to claim 1, wherein said second barrier layer is formed of aluminium oxide ($Al_2O_3$).

14. A device according to claim 1, wherein said buffer layer is formed of dielectric material.

15. A device according to claim 1, wherein said buffer layer is formed of silicon dioxide.

16. A device according to claim 1, wherein said layer of liner material forms a glue layer to assist adhesion of said first electrode to said buffer layer.

17. A device according to claim 1, wherein said dielectric layer is formed of PZT.

18. An FeRAM device comprising one or more devices according to claim 1.

* * * * *